(12) United States Patent
Amundson et al.

(10) Patent No.: US 6,312,971 B1
(45) Date of Patent: Nov. 6, 2001

(54) SOLVENT ANNEALING PROCESS FOR FORMING A THIN SEMICONDUCTOR FILM WITH ADVANTAGEOUS PROPERTIES

(75) Inventors: Karl Amundson, Cambridge; Jianna Wang, Waltham, both of MA (US)

(73) Assignee: E Ink Corporation, Cambridge, MA (US)

( * ) Notice: Subject to any disclaimer, the term of this patent is extended or adjusted under 35 U.S.C. 154(b) by 0 days.

(21) Appl. No.: 09/652,486

(22) Filed: Aug. 31, 2000

Related U.S. Application Data (60) Provisional application No. 60/151,547, filed on Aug. 31, 1999.

(51) Int. Cl.[7] .................................................... H01L 51/40
(52) U.S. Cl. .................................................................. 438/99
(58) Field of Search ................................. 438/22, 34, 99, 438/142, 149; 257/40, 213

(56) References Cited

U.S. PATENT DOCUMENTS

| | | |
|---|---|---|
| 4,439,507 | 3/1984 | Pan et al. . |
| 4,502,934 | 3/1985 | Gazard et al. . |

(List continued on next page.)

FOREIGN PATENT DOCUMENTS

| | | |
|---|---|---|
| 0 087 193 | 8/1983 | (EP) . |
| 0 240 063 B1 | 10/1987 | (EP) . |

(List continued on next page.)

OTHER PUBLICATIONS

Conboy, John et al., "Impact of solvent vapor annealing on the morphology and photophysics of molecular semiconductor thin films", J. Phys. Chem B 1998, 102; 4516–4525.*

Clarisse, C., et al., "Field Effect Transistor With Diphthalocyanine Thin Film," *Electronics Letters*, May 1988, vol. 24 (11) pp. 674–675.

Bao, Z. et al., "Soluble and Processable Regloregular Poly (3–hexlthiophene) for Thin Film Field–Effect Transistor Applications with High Mobility," *American Institute of Physics*, Dec. 23, 1996, vol. 69, pp. 4108–4110.

Bao, Z. et al., "High–Performance Plastic Transistors Fabricated by Printing Techniques," *American Chemical Society*, Feb. 26, 1997, pp. 1299–1301.

Dodabalpur, A. et al., "Organic Smart Pixels," *American Institute of Physics*, May 1998, p. 142.

Torsi, L. et al., "Organic Thin–Film–Transistors With High On/Off Ratios," *Materials Research Society*, 1996, vol. 377, pp. 695–700.

(List continued on next page.)

*Primary Examiner*—Charles Bowers
*Assistant Examiner*—Keith Christianson
(74) *Attorney, Agent, or Firm*—Testa, Hurwitz & Thibeault, LLP (57) ABSTRACT

A process for forming a relatively high quality, lower cost organic semiconductor film is provided. A substrate is formed by depositing an organic semiconductor film via a lower cost method such as printing or spin coating on a support substrate. A portion of a solvent is vaporized to bring the vapor into contact with the film. The chemical potential of the vapor molecules is controlled to provide an interaction with the organic semiconductor film to alter the molecular arrangement of the film. The process further entails placing the substrate on a first temperature controlled stage and placing the solvent on a second temperature controlled stage. The chemical potential of the vapor is adjusted by controlling the temperature of the solvent. Appropriate annealing conditions are obtained by adjusting the temperature of the solvent, the substrate, and the anneal time. The process can assist manufacturing of lower cost displays that utilize arrays of organic thin-film transistors.

18 Claims, 2 Drawing Sheets

U.S. PATENT DOCUMENTS

| | | |
|---|---|---|
| 4,543,306 | 9/1985 | Dubois et al. . |
| 4,909,959 | 3/1990 | Lemaire et al. . |
| 5,006,212 | 4/1991 | DiSanto et al. . |
| 5,059,694 | 10/1991 | Delabouglise et al. . |
| 5,132,049 | 7/1992 | Garreau et al. . |
| 5,149,826 | 9/1992 | Delabouglise et al. . |
| 5,204,424 | 4/1993 | Roncali et al. . |
| 5,268,448 | 12/1993 | Buechner et al. . |
| 5,347,144 | 9/1994 | Garnier et al. . |
| 5,574,291 | 11/1996 | Dodabalapur et al. . |
| 5,596,208 | 1/1997 | Dodabalapur et al. . |
| 5,625,199 | 4/1997 | Baumbach et al. . |
| 5,659,181 | 8/1997 | Bridenbaugh et al. . |
| 5,693,977 | 12/1997 | Haddon et al. . |
| 5,705,826 | 1/1998 | Aratani et al. . |
| 5,936,259 | 8/1999 | Katz et al. . |
| 5,969,376 | 10/1999 | Bao . |
| 6,005,791 | 12/1999 | Gudesen et al. . |
| 6,005,817 | 12/1999 | Gudesen et al. . |
| 6,107,117 | 8/2000 | Bao et al. . |

FOREIGN PATENT DOCUMENTS

| | | |
|---|---|---|
| 0 323 656 B1 | 7/1989 | (EP) . |
| 0 375 005 B1 | 6/1990 | (EP) . |
| 0 396 937 A2 | 11/1990 | (EP) . |
| 0 402 269 A1 | 12/1990 | (EP) . |
| 0 408 105 B1 | 1/1991 | (EP) . |
| 0 442 123 A1 | 8/1991 | (EP) . |
| 0 537 240 B1 | 4/1993 | (EP) . |
| 0 802 217 A2 | 10/1997 | (EP) . |
| 0 825 657 A2 | 2/1998 | (EP) . |
| 0 852 403 A1 | 7/1998 | (EP) . |
| 0 924 551 | 6/1999 | (EP) . |
| 0 962 984 A2 | 12/1999 | (EP) . |
| 0 981 165 A1 | 2/2000 | (EP) . |
| 04199638 | 7/1992 | (JP) . |
| 10135481 | 5/1998 | (JP) . |
| 10142628 | 5/1998 | (JP) . |
| 10190001 | 7/1998 | (JP) . |
| 11195790 | 7/1999 | (JP) . |
| WO 90/08402 | 7/1990 | (WO) . |
| WO 98/12585 | 3/1998 | (WO) . |
| WO 98/55897 | 12/1998 | (WO) . |
| WO 99/53371 | 10/1999 | (WO) . |

OTHER PUBLICATIONS

Horowitz, G., "Organic Field–Effect Transistors," *Advanced Materials*, 1998, vol. 10 No. 5, pp. 365–377.

McCullough, R.D., "The Chemistry of Conducting Polythiophenes," *Advanced Materials*, 1998, vol. 10 No. 2, pp. 93–116.

Drobac, "Fluidic Self–Assembly Could Change the Way FPDs Are Made," *Information Display*, Nov. 1999, pp. 12–16.

Garnier et al., "All–Polymer Field–Effect Transistor Realized by Printing Techniques," Sep. 6, 1994, vol. 265, pp. 1684–1686.

Lu et al, "Studies of Polymer–Based Field Effect Transistors," Sep. 1993, vol. 2, pp. 814–816.

Masui et al, "Effect of Crystallinity on Electrical Conductivity of Alpha CU–Phthalocyanin Film," May 1, 1992, vol. 112A, No. 5, pp. 371–374.

Ridley et al, "All–Inorganic Field Effect Transistors Fabricated by Printing," *Science*, Oct. 22, 1999, vol. 286, pp. 746–748.

Nakabu, S. et al, "The Development of Super–High Aperture Ratio With Low Electrically Resistive Material for High–Resolution TFT–LCDs," SID 99 Digest, pp. 732–735.

Conboy et al., "Impact of Solvent Vapor Annealing on the Morphology and Photophysics of Molecular Semiconductor Thin Films," Journal of Physical Chemistry B, vol. 102, No. 23, Jun. 4, 1998, pp. 4516–4525.

Dyreklev et al., "Polymeric Field Effect Transistors Using Oriented Polymers," International Conference on Science and Technology of Synthetic Metals, vol. 57, No. 1, Aug. 12–18, 1992, pp. 4093–4098.

* cited by examiner

SOLVENT ANNEALING PROCESS FOR FORMING A THIN SEMICONDUCTOR FILM WITH ADVANTAGEOUS PROPERTIES

RELATED APPLICATIONS

This application claims the benefit of provisional application U.S. Ser. No. 60/151,547 filed on Aug. 31, 1999 the entire contents of which are incorporated herein by reference.

TECHNICAL FIELD

The invention relates generally to manufacturing of semiconductor devices and more particularly to the manufacture of patterned organic layers in organic material-based electronic devices.

BACKGROUND OF THE INVENTION

Thin films of organic semiconductor material can be used in the construction of thin-film transistors (TFT). Performance of organic TFT's (OTFT), characterized by parameters such as the field effect mobility and threshold voltage, depends in part upon the molecular structure of the semiconductor film. Factors such as interfacial structure, the degree of molecular order and crystalline orientation of the thin film affect film properties.

Ordering of the semiconductor depends in turn on how the thin film is deposited. It is generally believed that increasing the amount of molecular order—by increasing crystal size, reducing the density of crystalline defects, or improving short-range molecular order-permits charge carriers, i.e. electrons or holes, to more efficiently move between molecules. This can increase the field effect mobility.

Advantageous molecular order that gives high field effect mobility can be achieved using some relatively expensive deposition techniques. In contrast, deposition techniques that enable inexpensive production or production of films of a desired uniformity and thickness can produce films that exhibit a relatively small field-effect mobility.

For example, a solvent cast film that is permitted to slowly dry often exhibits a relatively high field effect mobility when incorporated into an OTFT. Unfortunately, some deposition techniques that are more amenable to manufacturing do not readily permit slow evaporation of solvent. For example, though spin coating can yield relatively uniform thin films, the solvent usually leaves the film relatively quickly, generally leading to a low degree of crystal order. Field-effect mobility, for example, can be a factor of about 10 to 100 smaller than for cast films. Other manufacturing processes such as screen printing or various thin-film coating methods may yield desirable film morphology, but not desirable molecular order.

What are needed are lower cost manufacturing methods that produce relatively high quality organic semiconductor films.

SUMMARY OF THE INVENTION

In one aspect, the invention relates to the manufacture of displays that utilize arrays of OTFT'S. The invention is of particular use in the production of displays with an electrophoretic display medium and mitigates the problem of poor quality organic layers obtained by lower cost manufacturing processes. The invention permits manufacturing of higher quality organic semiconductor layers while still utilizing lower cost organic film deposition methods.

In one aspect, after deposition of the organic semiconductor film, the film is annealed under the influence of a vapor derived from a solvent. The solvent is chosen for its ability to assist molecular rearrangement after diffusing into the organic semiconductor film. Annealing conditions are selected to provide molecular rearrangement that improves electrical properties while avoiding conditions that damage the film. Annealing conditions in some embodiments are determined by systematically varying the solvent temperature, the organic semiconductor film temperature, and the annealing time until an appropriate level of improvement in electrical properties is obtained.

In one embodiment, a substrate is formed by depositing an organic semiconductor film via a lower cost method such as printing or spin coating on a support substrate. A portion of a solvent is vaporized to bring the vapor into contact with the film. The chemical potential of the vapor molecules is controlled to provide an interaction with the organic semiconductor film to alter the molecular arrangement of the film. Some embodiments further entail placing the substrate on a first temperature controlled stage and placing the solvent on a second temperature controlled stage. The chemical potential of the vapor is adjusted by controlling the temperature of the solvent. Appropriate annealing conditions are obtained by adjusting the temperature of the solvent, the substrate, and the anneal time. This process can assist manufacturing of lower cost displays that utilize arrays of organic thin-film transistors.

BRIEF DESCRIPTION OF THE DRAWINGS

The invention, in accordance with preferred and exemplary embodiments, together with further advantages thereof, is more particularly described in the following detailed description, taken in conjunction with the accompanying drawings.

In the drawings, like reference characters generally refer to the same parts throughout the different views. Also, the drawings are not necessarily to scale, emphasis instead generally being placed upon illustrating principles of the invention.

DETAILED DESCRIPTION OF THE INVENTION

Figure 1:
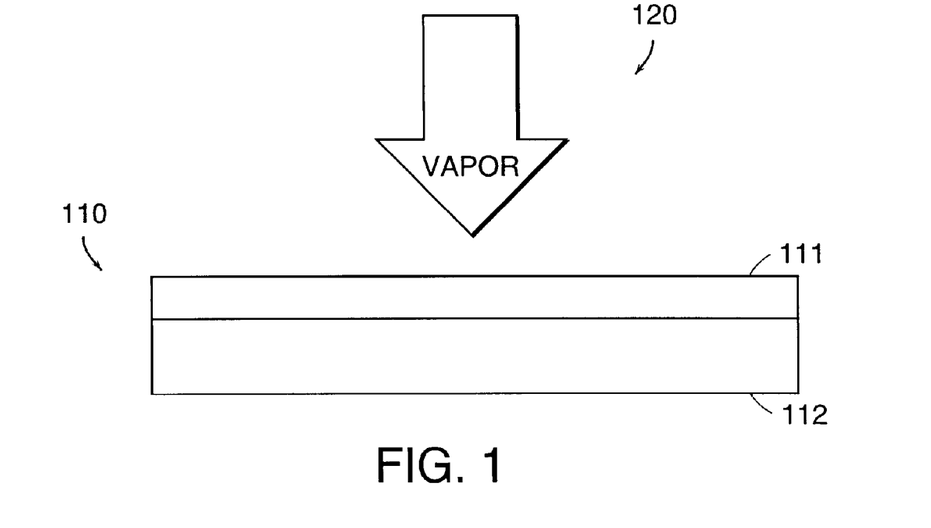
FIG. 1 shows a cross-sectional view of a substrate undergoing annealing.

In broad overview, an embodiment of a method of solvent annealing of an organic semiconductor film is shown in FIG. 1. Solvent annealing is here understood to mean the subjecting of a material to the influence of a solvent for a period of time with the goal of a desirable change in the material. A substrate 110 comprising an organic semiconductor film 111 is provided. In the embodiment shown in FIG. 1, provision of the substrate 110 comprises depositing the organic semiconductor film 111 on a support substrate 112. In preferred embodiments, the organic semiconductor film 111 is one which has utility in fabrication of electronic devices, for example, organic thin-film transistors (OTFT).

One such organic semiconductor film 111 is comprised of poly(alkylthiophene). Other possible organic semiconductor films 111 include solution processable dihexyl-alfasexithiophene, dihexyl-quinquethiophene, and alkyl or fluoroalkyl substituted naphthalenetetracarboxylic diimides.

In preferred embodiments, the organic semiconductor film 111 is printed. As used herein, the term "printing" includes all forms of printing and coating, including, but not limited to, pre-metered coatings such as patch die coating, slot or extrusion coating, slide or cascade coating, and curtain coating: roll coating such as knife over roll coating, forward and reverse roll coating, gravure coating, dip coating, spray coating, meniscus coating, spin coating, brush coating, air knife coating, silk screen printing processes, electrostatic printing processes, thermal printing processes, ink jet printing processes and other similar techniques. This will typically produce a film with relatively poor molecular ordering and, consequently, relatively poor electrical properties.

To improve the molecular ordering, the organic semiconductor film 111 is next subjected to a solvent vapor 120. The solvent vapor may be obtained by vaporizing a portion of liquid solvent (not shown in FIG. 1). In the present description, the word "solvent" when used alone is understood to refer to the liquid phase of the solvent while "vapor" is understood to refer to the gas phase of the solvent.

The vapor molecules diffuse into the organic semiconductor film 111. An appropriate solvent is chosen such that the solvent is capable of causing desirable molecular rearrangement in the particular organic semiconductor film 111. For example, if the organic semiconductor film 111 comprises poly(alkylthiophene), an appropriate solvent is selected from the group comprising toluene, chloroform, and xylene.

For a given semiconductor, an appropriate solvent is experimentally screened. There are several ways to characterize the properties of the annealed films. Molecular crystallinity can be detected by X-ray diffraction. Alternatively, performance of transistors based on the annealed semiconductor is a direct indicator of film morphology.

By selecting appropriate annealing conditions, the presence of solvent in the organic semiconductor film 111 contributes to a desirable, relatively local, rearrangement of the molecular structure of a relatively poor, as-deposited organic semiconductor film 111.

By selecting an appropriate chemical potential for the vapor 120, temperature for the organic semiconductor film 111, and annealing time, optimized improvement of molecular order via molecular rearrangement is obtained. In general, two alternatives are a consequence of inappropriate selection of annealing conditions. Firstly, inappropriate conditions can lead to insubstantial changes in molecular structure and related insubstantial improvements in electrical properties. This situation can occur, for example, when the chemical potential of the vapor 120 is too low and insufficient vapor molecules enter the organic semiconductor film 111. Secondly, inappropriate conditions can lead to excessive molecular rearrangements and potential degradation in electrical properties of the organic semiconductor film 111. Too high a chemical potential of the vapor 120, for example, can lead to excessive entry of vapor molecules into the organic semiconductor film 111 and gross changes in structure.

In one embodiment, optimum annealing conditions are determined empirically. For example, for a particular organic semiconductor film 111 and solvent pair, substrate temperature, vapor 120 chemical potential, and annealing time are systematically varied, using samples of the particular organic semiconductor film 111. Electrical measurements are made on the samples and an optimum or preferable annealing condition is determined. In an alternative embodiment, a production organic semiconductor film 111 is electrically monitored during annealing. When a desired level of improvement in electrical properties is attained, the annealing treatment is ended.

Varying the chemical potential of the vapor 120 will typically vary the density of solvent molecules in the organic semiconductor film 111. In some embodiments, the combination of varying the chemical potential of the vapor 120 and selecting an appropriate annealing time can suffice to provide a preferable annealing condition. In other embodiments, varying the temperature of the organic semiconductor film 111 is also useful in obtaining desirable molecular rearrangements and a preferable annealing condition.

Further considerations can assist in appropriate selection and use of a solvent. In some embodiments, solvents with an appreciable vapor pressure relative to other solvents are considered for use during annealing. Generally, the chemical potential must be high enough so that sufficient solvent molecules enter the organic semiconductor film 111 to enable desirable molecular rearrangements. Conversely, the chemical potential must not be so high as to lead to undesirable molecular rearrangements, for example, gross disordering. In particular, too high a chemical potential can also lead to dewetting of the organic semiconductor film 111. In one embodiment, the chemical potential of the vapor 120 is controlled by selecting a solvent temperature in a range of about 0° C. to about 50° C.

Further, too great a disparity in the solvent temperature, where applied to increase the chemical potential of the vapor 120, and the temperature of the organic semiconductor film 111 can lead to condensation of solvent on the organic semiconductor film 111. This can lead to localized or wide scale dissolution of the organic semiconductor film 111, causing a decline rather than the desired improvement in electrical properties. This situation can be remedied by raising the temperature of the organic semiconductor film 111 or decreasing the temperature of the solvent. In one embodiment, the organic semiconductor film 111 temperature is in a range of about 80° C. to about 150 C. In another embodiment, the temperature difference between the organic semiconductor film 111 and the solvent is kept substantially small, for example not more than about 10–15° C. Again, in preferred embodiments, annealing conditions are selected to provide desired improvements in electrical properties.

Figure 2:
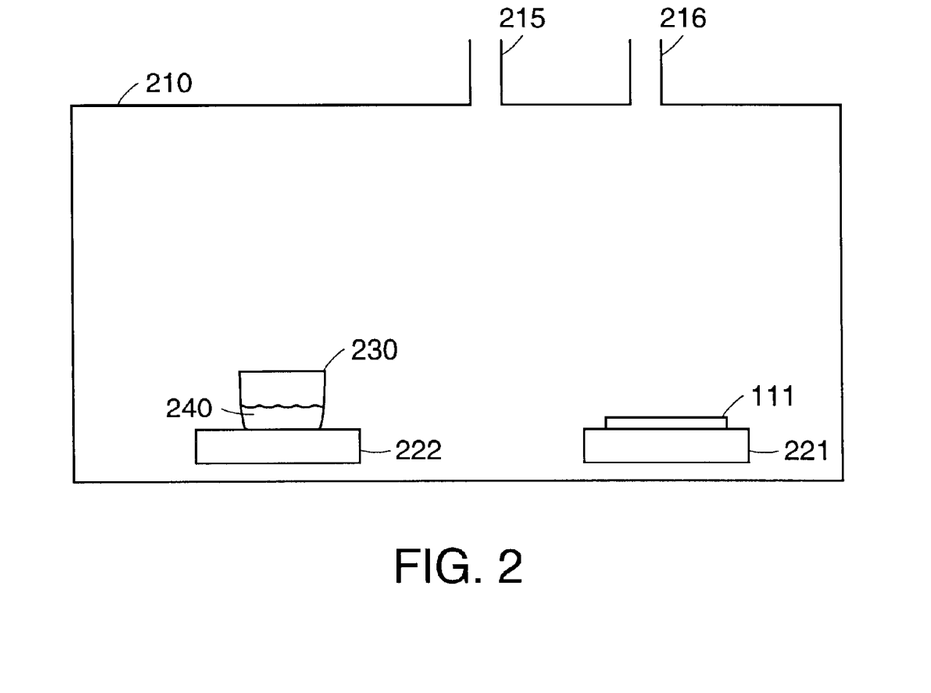
FIG. 2 shows a cross-sectional view of an embodiment of a chamber for annealing of substrates.

Referring to FIG. 2, a more detailed embodiment of a method of annealing the organic semiconductor film 111 is now described. A chamber 210 is provided as an enclosure for the annealing of the organic semiconductor film 111. The chamber 210 is sufficiently sealed to prevent undesirable leakage of vapor 120 or other gases. The chamber further comprises a gas outlet 215 for removal of gases from the chamber 210 and a gas inlet 216 for admission of gases to the chamber. For example the outlet 215 and the inlet 216 can each comprise a valve. In some embodiments, the outlet 215 and the inlet 216 are provided by a single port in the chamber 210.

The embodiment illustrated by FIG. 2 further comprises a first stage 221 on which resides the organic semiconductor film 111 and a second stage 222 on which resides a reservoir 240, for example a beaker, for holding solvent 240. The stages 221, 222 in preferred embodiments are each provided with heating or cooling means for control of the temperatures of the organic semiconductor film 111 and the solvent 240. Means for distributing vapor 120 within the chamber 210 (not shown), for example, via use of a fan, can be utilized. In another embodiment, a portion of the walls of the chamber 210 is cooled or heated to control the temperature of the vapor 120.

In another embodiment, the solvent 240 resides outside the chamber 210 and the vapor 120 diffuses or is pumped into the chamber 210.

In one aspect, the chamber 210 provides for confinement of vapor 120 during the annealing process. Since the vapor 120 is typically flammable, safety precautions are desirable during annealing processing. Purging of air via outlet 215 prior to annealing can reduce the mixing of oxygen with the vapor 120. For example, the chamber can be evacuated followed by admission of an inert gas, for example nitrogen or argon, via the inlet 216. During annealing, the mixture of the vapor 120 with an inert gas can reduce the chance of fire or explosion occurring within the chamber.

Similarly, the chamber 210 preferably is sufficiently gas tight so that flammable mixtures of air and vapor 120 do not form outside the chamber 210. Risk of sparking from electrical devices, for example from some types of heating means, can be minimized to further improve safety. After annealing and prior to removal of the organic semiconductor film 111 from the chamber 210, the chamber 210 can be purged of vapor 120 via the outlet 215 to avoid release of flammable vapor 120 into the air in the vicinity of the chamber 210. Avoidance of glass materials in the construction of the chamber 210 and use of explosion guards can further improve safety.

At the conclusion of annealing, the organic semiconductor film 111 will typically emit vapor 120 for a period of time. To again avoid the hazards of flammable vapor 120 and air mixtures, this period of time can be allowed to lapse with the organic semiconductor film 111 still residing within the chamber 210. In some embodiments, this period of time can be accommodated by placing the organic semiconductor film 111 in a drying chamber (not shown). In another embodiment, the organic semiconductor film 111 is heated while in the drying chamber to reduce the period of time that vapor 120 is emitted by the organic semiconductor film 111. Preferably, the drying temperature is below the boiling point of the solvent at the pressure to which it is exposed.

In another embodiment, determination of appropriate annealing conditions for use with the chamber 210 are developed via an iterative process. A solvent 240 can first be selected from those known to potentially swell or dissolve the organic semiconductor film 111 to be annealed. This characteristic is typically indicative of a solvent's ability to promote molecular rearrangements in the organic semiconductor film 111. In contrast, the solvent 240 is preferably chosen from those not damaging to other materials comprised by the substrate 110.

Next, test anneals can be conducted for various temperatures of the solvent 240 and the organic semiconductor film 111 for varying anneal times. Systematic variation of parameters is preferred to derive appropriate annealing conditions in an efficient manner. In one embodiment, one begins with relatively low solvent 240 temperatures and anneal times so that the same sample of the organic semiconductor film 111 can be retested until a regime of appropriate annealing conditions is found. This approach can reduce waste of sample material used for determination of annealing conditions.

Figure 3:
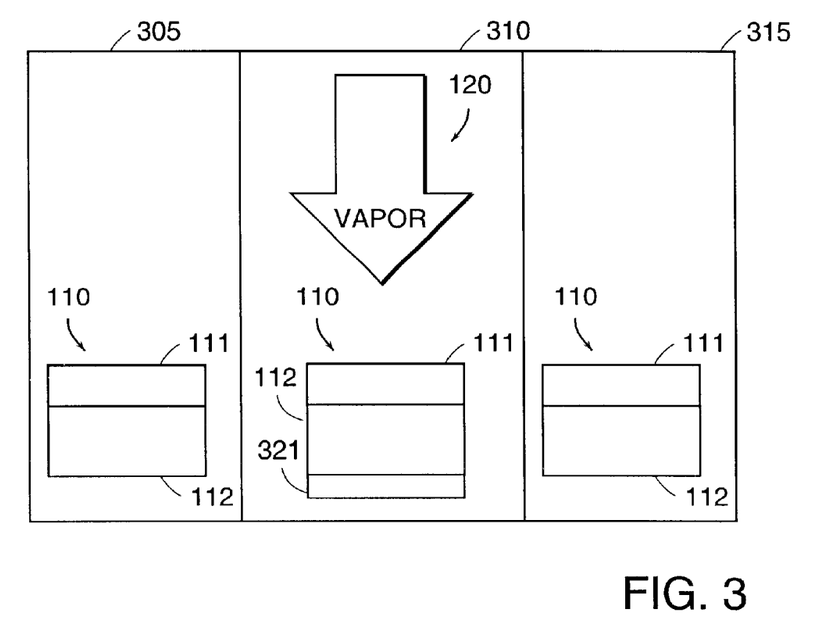
FIG. 3 shows a cross-sectional view of an embodiment of a device having multiple chambers for annealing of substrates.

With reference to FIG. 3, a more detailed embodiment of relevance to larger scale manufacturing is depicted. A multiple chamber apparatus 300 for higher throughput annealing comprises a first chamber 305 for preloading of substrates 110, a second chamber 310 for annealing, and a third chamber 315 for drying or removal of the substrate 110.

The first chamber 305 can be a loadlock. The organic semiconductor film 111 can be sealed in the first chamber. In one embodiment, the first chamber 305 is then evacuated and an inert gas is admitted to the first chamber 305 to match the level of inert gas in the second chamber 310. If desired, the substrate 110 can be heated while in the first chamber 305. The organic semiconductor film 111 is then transported to a first stage 321 in the second chamber and the second chamber 321 is sealed. Annealing conditions can then be applied to the organic semiconductor film 111.

Upon completion of annealing, the organic semiconductor film 111 can be transferred to the third chamber 315 for removal from the multiple chamber apparatus 300 or to allow for removal of solvent from the organic semiconductor film 111. Heat can be applied to the organic semiconductor film 111 while in the third chamber 315 for this purpose. Matching of inert gas type and level can be used, as for transfers from the first chamber 305 to the second chamber 310, when transferring the organic semiconductor film 111 from the second chamber 310 to the third chamber 315.

For higher volume manufacturing, samples can occupy all three chambers 305, 310, 315 simultaneously. Further, for greater throughput, solvent 240 temperature can be maintained during transfer of wafers without substantial release of vapor 120 into the surrounding air. For example, after transfer of the organic semiconductor film 111 from the first chamber 305 to the second chamber 310, the first chamber 305 is sealed from the second chamber 310 and evacuated to remove vapor 120 prior to opening of the first chamber 305 to room air for placement of another organic semiconductor film 111 for processing.

Further embodiments provide other alternatives to increase processing ease or throughput. An apparatus with greater numbers of chambers can be employed. Turntables or conveyor belt systems can be employed to anneal more than one organic semiconductor film 111 at one time. More than one organic semiconductor film 111 can be stacked vertically or horizontally as further alternatives to permit processing of more than one organic semiconductor film 111 at one time.

The above described method can be advantageously applied to manufacturing of organic thin-film transistors (OTFT). In a preferred embodiment, anays of OTFTs are produced as one stage in the production of display devices. Lower cost and higher quality organic semiconductor films 111 can be produced to aid in the manufacture of larger and lower cost displays.

Figure 4:
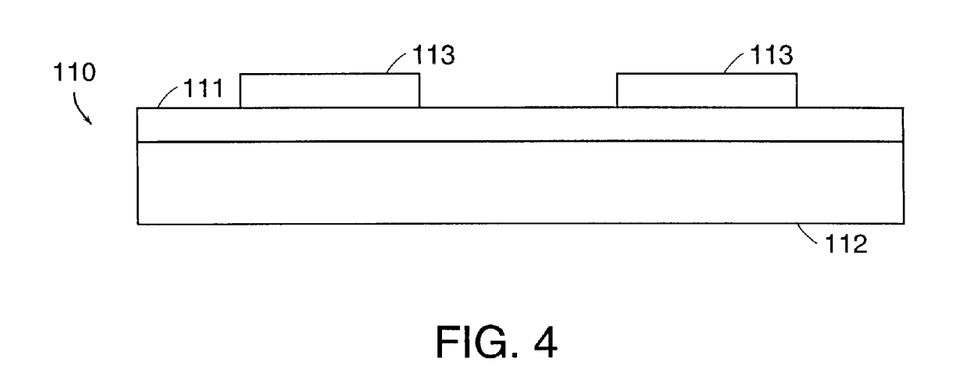
FIG. 4 shows a cross-sectional view of an embodiment of an electronic device at an intermediate stage of fabrication.

Referring to FIG. 4, a further embodiment incorporates a mask 113 to delineate annealed and unannealed regions on the organic semiconductor film 111. The mask material is a barrier to the solvent 140 and is applied to the organic semiconductor film 111 prior to annealing. The mask is designed to admit vapor 120 to regions of the organic semiconductor film 111 where OTFTs will be formed while excluding vapor 120 from regions of organic semiconductor film 111 that lie between the OTFT locations. In this way, regions of the organic semiconductor film 111 that separate OTFTs can be produced with poorer conductivity than possessed by regions from which OTFTs are formed. In this manner, leakage currents between neighboring OTFTs can be reduced.

The above described method is of use in the manufacture of electrophoretic displays, in particular for application in the fabrication of active matrix addressing logic comprising an OTFT array. A display manufactured with relatively high quality OTFT's and a microencapsulated electrophoretic display medium has the advantages of large size potential, relatively low cost manufacturing, and a resulting thin, flexible, low-power consumption display. A detailed description of methods and materials of relevance to the manufacture of electrophoretic displays follows.

Method Of Manufacturing An Electrophoretic Display Assembly

In a preferred embodiment, an encapsulated electrophoretic display assembly is manufactured with use of printing or coating steps on a wide variety of flexible substrates. As noted above, the term "printing" herein includes all forms of printing and coating, including, but not limited to, pre-metered coatings such as patch die coating, slot or extrusion coating, slide or cascade coating, and curtain coating: roll coating such as knife over roll coating, forward and reverse roll coating, gravure coating, dip coating, spray coating, meniscus coating, spin coating, brush coating, air knife coating, silk screen printing processes, electrostatic printing processes, thermal printing processes, and other similar techniques. Thus, the resulting display can be flexible. Further, because the display medium can be printed (using a variety of methods), the display itself can be made inexpensively.

Further, printing methods can be used to form the electrical connections and other conductive portions of a display. A rear conductor ("rear" referring to a side of a display that is opposite to that viewed by a user) can be ether opaque or transparent. This allows the use of a variety of printed rear conductors, including graphite inks, silver inks, or conductive polymers.

The front conductor ("front" referring to a side of a display that is viewed by a user) must be transparent, but need not have excellent conductivity. Even materials with relatively poor conductivity, though amenable to printing, can be employed, for example conductive colloidal suspensions and conductive polymers such as are commonly used in anti-static applications.

A microencapsulated electrophoretic medium, unlike a liquid crystal medium, is amendable to use with a wide number of intrinsically conductive polymer systems, including derivatives of polyaniline, polypyrrole, polythiophene, and polyphenylenevinylene.

In short, the present invention permits a more advantageous use of cost savings allowed by use of printing methods for formation of conducting materials in a display assembly.

The following describes in detail various embodiments of materials with applications to the electrophoretic display medium.

Materials for Use in Electrophoretic Displays

Useful materials for constructing the above-described encapsulated electrophoretic displays are discussed in detail below. Many of these materials will be known to those skilled in the art of constructing conventional electrophoretic displays, or those skilled in the art of microencapsulation.

A. Particles

There is much flexibility in the choice of particles for use in electrophoretic displays, as described above. For purposes of this invention, a particle is any component that is charged or capable of acquiring a charge (i.e., has or is capable of acquiring electrophoretic mobility), and, in some cases, this mobility may be zero or close to zero (i.e., the particles will not move). The particles may be neat pigments, dyed (laked) pigments or pigment/polymer composites, or any other component that is charged or capable of acquiring a charge. Typical considerations for the electrophoretic particle are its optical properties, electrical properties, and surface chemistry. The particles may be organic or inorganic compounds, and they may either absorb light or scatter light. The particles for use in the invention may further include scattering pigments, absorbing pigments and luminescent particles. The particles may be retroreflective, such as corner cubes, or they may be electroluminescent, such as zinc sulfide particles, which emit light when excited by an AC field, or they may be photoluminescent. Finally, the particles may be surface treated so as to improve charging or interaction with a charging agent, or to improve dispersibility.

A preferred particle for use in electrophoretic displays of the invention is Titania. The titania particles may be coated with a metal oxide, such as aluminum oxide or silicon oxide, for example. The titania particles may have one, two, or more layers of metaloxide coating. For example, a titania particle for use in electrophoretic displays of the invention may have a coating of aluminum oxide and a coating of silicon oxide. The coatings may be added to the particle in any order.

The electrophoretic particle is usually a pigment, a polymer, a laked pigment, or some combination of the above. A neat pigment can be any pigment, and, usually for a light colored particle, pigments such as, for example, rutile (titania), anatase (titania), barium sulfate, kaolin, or zinc oxide are useful. Some typical particles have high refractive indices, high scattering coefficients, and low absorption coefficients. Other particles are absorptive, such as carbon black or colored pigments used in paints and inks. The pigment should also be insoluble in the suspending fluid. Yellow pigments such as diarylide yellow, hansa yellow, and benzidin yellow have also found use in similar displays. Any other reflective material can be employed for a light colored particle, including non-pigment materials, such as metallic particles.

Useful pigments include, but are not limited to, $PbCrO_4$, Cyan blue GT 55-3295(American Cyanamid Company, Wayne, N.J.), Cibacron Black BG (Ciba Company, Inc., Newport, Del.), Cibacron Turquoise Blue G (Ciba), Cibalon Black BGL (Ciba), Orasol Black BRG (Ciba), Orasol Black RBL (Ciba), Acetamine Blac, CBS (E.I. du Pont de Nemours and Company, Inc., Wilmington, Del.), Crocein Scarlet N Ex (du Pont) (27290), Fiber Black VF (DuPont) (30235), Luxol Fast Black L (DuPont) (Solv. Black 17), Nirosine Base No. 424 (DuPont) (50415 B), Oil Black BG (DuPont) (Solv. Black 16), Rotalin Black RM (DuPont), Sevron Brilliant Red 3 B (DuPont); Basic Black DSC (Dye Specialties, Inc.), Hectolene Black (Dye Specialties, Inc.), Azosol Brilliant Blue B (GAF, Dyestuff and Chemical Division, Wayne, N.J.) (Solv. Blue 9), Azosol Brilliant Green BA (GAF) (Solv. Green 2), Azosol Fast Brilliant Red B (GAF), Azosol Fast Orange RA Conc. (GAF) (Solv. Orange 20), Azosol Fast Yellow GRA Conc. (GAF) (13900 A), Basic Black KMPA (GAF), Benzofix Black CW-CF (GAF) (35435), Cellitazol BNFV Ex Soluble CF (GAF) (Disp. Black 9), Celliton Fast Blue AF Ex Conc (GAF) (Disp. Blue 9), Cyper Black IA (GAF) (Basic Blk. 3), Diamine Black CAP Ex Conc (GAF) (30235), Diamond Black EAN Hi Con. CF (GAF) (15710), Diamond Black PBBA Ex (GAF) (16505); Direct Deep Black EA Ex CF (GAF) (30235), Hansa Yellow G (GAF) (11680); Indanthrene Black BBK Powd. (GAF) (59850), Indocarbon CLGS Conc. CF (GAF) (53295), Katigen Deep Black NND Hi Conc. CF (GAF) (15711), Rapidogen Black 3 G (GAF) (Azoic Blk. 4); Sulphone Cyanine Black BA-CF (GAF) (26370), Zambezi Black VD Ex Conc. (GAF) (30015); Rubanox Red CP-1495 (The Sherwin-Williams Company, Cleveland, Ohio) (15630); Raven 11 (Columbian Carbon Company, Atlanta, Ga.), (carbon black aggregates with a particle size of about 25 $\mu$m), Statex B-12 (Columbian Carbon Co.) (a furnace black of 33 $\mu$m average particle size), and chrome green.

Particles may also include laked, or dyed, pigments. Laked pigments are particles that have a dye precipitated on them or which are stained. Lakes are metal salts of readily soluble anionic dyes. These are dyes of azo, triphenylmethane or anthraquinone structure containing one or more sulphonic or carboxylic acid groupings. They are usually precipitated by a calcium, barium or aluminum salt onto a substrate. Typical examples are peacock blue lake (CI Pigment Blue 24) and Persian orange (lake of CI Acid Orange 7), Black M Toner (GAF) (a mixture of carbon black and black dye precipitated on a lake).

A dark particle of the dyed type may be constructed from any light absorbing material, such as carbon black, or inorganic black materials. The dark material may also be selectively absorbing. For example, a dark green pigment may be used. Black particles may also be formed by staining latices with metal oxides, such latex copolymers consisting of any of butadiene, styrene, isoprene, methacrylic acid, methyl methacrylate, acrylonitrile, vinyl chloride, acrylic acid, sodium styrene sulfonate, vinyl acetate, chlorostyrene, dimethylaminopropylmethacrylamide, isocyanoethyl methacrylate and N(isobutoxymethacrylamide), and optionally including conjugated diene compounds such as diacrylate, triacrylate, dimethylacrylate and trimethacrylate. Black particles may also be formed by a dispersion polymerization technique.

In the systems containing pigments and polymers, the pigments and polymers may form multiple domains within the electrophoretic particle, or be aggregates of smaller pigment/polymer combined particles. Alternatively, a central pigment core may be surrounded by a polymer shell. The pigment, polymer, or both can contain a dye. The optical purpose of the particle may be to scatter light, absorb light, or both. Useful sizes may range from 1 nm up to about 100 $\mu$m, as long as the particles are smaller than the bounding capsule. In a preferred embodiment, the density of the electrophoretic particle may be substantially matched to that of the suspending (i.e., electrophoretic) fluid. As defined herein, a suspending fluid has a density that is "substantially matched" to the density of the particle if the difference in their respective densities is between about zero and about two g/ml. This difference is preferably between about zero and about 0.5 g/ml.

Useful polymers for the particles include, but are not limited to: polystyrene, polyethylene, polypropylene, phenolic resins, Du Pont Elvax resins (ethylene-vinyl acetate copolymers), polyesters, polyacrylates, polymethacrylates, ethylene acrylic acid or methacrylic acid copolymers (Nucrel Resins-DuPont, Primacor Resins-Dow Chemical), acrylic copolymers and terpolymers (Elvacite Resins, DuPont) and PMMA. Useful materials for homopolymer/ pigment phase separation in high shear melt include, but are not limited to, polyethylene, polypropylene, polymethylmethacrylate, polyisobutylmethacrylate, polystyrene, polybutadiene, polyisoprene, polyisobutylene, polylauryl methacrylate, polystearyl methacrylate, polyisobornyl methacrylate, poly-tbutyl methacrylate, polyethyl methacrylate, polymethyl acrylate, polyethyl acrylate, polyacrylonitrile, and copolymers of two or more of these materials. Some useful pigment/polymer complexes that are commercially available include, but are not limited to, Process Magenta PM 1776 (Magruder Color Company, Inc., Elizabeth, N.J.), Methyl Violet PMA VM6223 (Magruder Color Company, Inc., Elizabeth, N.J.), and Naphthol FGR RF6257 (Magruder Color Company, Inc., Elizabeth, N.J.).

The pigment-polymer composite may be formed by a physical process, (e.g., attrition or ball milling), a chemical process (e.g., microencapsulation or dispersion polymerization), or any other process known in the art of particle production. From the following non-limiting examples, it may be seen that the processes and materials for both the fabrication of particles and the charging thereof are generally derived from the art of liquid toner, or liquid immersion development. Thus any of the known processes from liquid development are particularly, but not exclusively, relevant.

New and useful electrophoretic particles may still be discovered, but a number of particles already known to those skilled in the art of electrophoretic displays and liquid toners can also prove useful. In general, the polymer requirements for liquid toners and encapsulated electrophoretic inks are similar, in that the pigment or dye must be easily incorporated therein, either by a physical, chemical, or physicochemical process, may aid in the colloidal stability, and may contain charging sites or may be able to incorporate materials which contain charging sites. One general requirement from the liquid toner industry that is not shared by encapsulated electrophoretic inks is that the toner must be capable of "fixing" the image, i.e., heat fusing together to create a uniform film after the deposition of the toner particles.

Typical manufacturing teclniques for particles are drawn from the liquid toner and other arts and include ball milling, attrition, jet milling, etc. The process will be illustrated for the case of a pigmented polymeric particle. In such a case the pigment is compounded in the polymer, usually in some kind of high shear mechanism such as a screw extruder. The composite material is then (wet or dry) ground to a starting size of around 10 $\mu$m. It is then dispersed in a carrier liquid, for example ISOPAR® (Exxon, Houston, Tex.), optionally with some charge control agent(s), and milled under high shear for several hours down to a final particle size and/or size distribution.

Another manufacturing technique for particles drawn from the liquid toner field is to add the polymer, pigment, and suspending fluid to a media mill. The mill is started and simultaneously heated to temperature at which the polymer swells substantially with the solvent. This temperature is typically near 100° C. In this state, the pigment is easily encapsulated into the swollen polymer. After a suitable time, typically a few hours, the mill is gradually cooled back to ambient temperature while stirring. The milling may be continued for some time to achieve a small enough particle size, typically a few microns in diameter. The charging agents may be added at this time. Optionally, more suspending fluid may be added.

Chemical processes such as dispersion polymerization, mini- or micro-emulsion polymerization, suspension polymerization precipitation, phase separation, solvent evaporation, in situ polymerization, seeded emulsion polymerization, or any process which falls under the general category of microencapsulation may be used. A typical process of this type is a phase separation process wherein a dissolved polymeric material is precipitated out of solution onto a dispersed pigment surface through solvent dilution, evaporation, or a thermal change. Other processes include chemical means for staining polymeric lattices, for example with metal oxides or dyes.

B. Suspending Fluid

The suspending fluid containing the particles can be chosen based on properties such as density, refractive index, and solubility. A preferred suspending fluid has a low dielectric constant (about 2), high volume resistivit (about $10^{15}$ low viscosity (less than 5 cst), low toxicity and environmental impact, low water solubility (less than 10 ppm), high specific gravity (greater than 1.5), a high boiling point (greater than 90° C.), and a low refractive index (less than 1.2).

The choice of suspending fluid may be based on concerns of chemical inertness, density matching to the electrophoretic particle, or chemical compatibility with both the electrophoretic particle and bounding capsule. The viscosity of the fluid should be low when movement of the particles is desirable. The refractive index of the suspending fluid may also be substantially matched to that of the particles. As used herein, the refractive index of a suspending fluid "is substantially matched" to that of a particle if the difference between their respective refractive indices is between about zero and about 0.3, and is preferably between about 0.05 and about 0.2.

Additionally, the fluid may be chosen to be a poor solvent for some polymers, which is advantageous for use in the fabrication of microparticles because it increases the range of polymeric materials useful in fabricating particles of polymers and pigments. Organic solvents, such as halogenated organic solvents, saturated linear or branched hydrocarbons, silicone oils, and low molecular weight halogen-containing polymers are some useful suspending fluids. The suspending fluid may comprise a single fluid. The fluid will, however, often be a blend of more than one fluid in order to tune its chemical and physical properties. Furthermore, the fluid may contain surface modifiers to modify the surface energy or charge of the electrophoretic particle or bounding capsule. Reactants or solvents for the microencapsulation process (oil soluble monomers, for example) can also be contained in the suspending fluid. Charge control agents can also be added to the suspending fluid.

Useful organic solvents include, but are not limited to, epoxides, such as, for example, decane epoxide and dodecane epoxide; vinyl ethers, such as, for example, cyclohexyl vinyl ether and Decave® (International Flavors & Fragrances, Inc., New York, N.Y.); and aromatic hydrocarbons, such as, for example, toluene and naphthalene. Useful halogenated organic solvents include, but are not limited to, tetrafluorodibromoethylene, tetrachloroethylene, trifluorochloroethylene, 1,2,4-trichlorobenzene, carbon tetrachloride. These materials have high densities. Useful hydrocarbons include, but are not limited to, dodecane, tetradecane, the aliphatic hydrocarbons in the Isopar series (Exxon, Houston, Tex.), Norpar® (series of normal paraffinic liquids), Shell-Sol® (Shell, Houston, Tex.), and Sol-Trol® (Shell), naphtha, and other petroleum solvents. These materials usually have low densities. Useful examples of silicone oils include, but are not limited to, octamethyl cyclosiloxane and higher molecular weight cyclic siloxanes, poly (methyl phenyl siloxane), hexamethyldisiloxane, and polydimethylsiloxane. These materials usually have low densities. Useful low molecular weight halogen-containing polymers include, but are not limited to, poly(chlorotrifluoroethylene) polymer (Halogenated hydrocarbon Inc., River Edge, N.J.), Galden® (a perfluorinated ether from Ausimont, Morristown, N.J.), or Krytox® from DuPont (Wilmington, Del.). In a preferred embodiment, the suspending fluid is a poly (chlorotrifluoroethylene) polymer. In a particularly preferred embodiment, this polymer has a degree of polymerization from about 2 to about 10. Many of the above materials are available in a range of viscosities, densities, and boiling points.

The fluid must be capable of being formed into small droplets prior to a capsule being formed. Processes for forming small droplets include flow-through jets, membranes, nozzles, or orifices, as well as shear-based emulsifying schemes. The formation of small drops may be assisted by electrical or sonic fields. Surfactants and polymers can be used to aid in the stabilization and emulsification of the droplets in the case of an emulsion type encapsulation. A preferred surfactant for use in displays of the invention is sodium dodecylsulfate.

It can be advantageous in some displays for the suspending fluid to contain an optically absorbing dye. This dye must be soluble in the fluid, but will generally be insoluble in the other components of the capsule. There is much flexibility in the choice of dye material. The dye can be a pure compound, or blends of dyes to achieve a particular color, including black. The dyes can be fluorescent, which would produce a display in which the fluorescence properties depend on the position of the particles. The dyes can be photoactive, changing to another color or becoming colorless upon irradiation with either visible or ultraviolet light, providing another means for obtaining an optical response. Dyes could also be polymerizable, forming a solid absorbing polymer inside the bounding shell.

There are many dyes that can be chosen for use in encapsulated electrophoretic display. Properties important here include light fastness, solubility in the suspending liquid, color, and cost. These are generally from the class of azo, anthraquinone, and triphenylmethane type dyes and may be chemically modified so as to increase the solubility in the oil phase and reduce the adsorption by the particle surface.

A number of dyes already known to those skilled in the art of electrophoretic displays will prove useful. Useful azo dyes include, but are not limited to: the Oil Red dyes, and the Sudan Red and Sudan Black series of dyes. Useful anthraquinone dyes include, but are not limited to: the Oil Blue dyes, and the Macrolex Blue series of dyes. Useful triphenylmethane dyes include, but are not limited to, Michler's hydrol, Malachite Green, Crystal Violet, and Auramine O.

C. Charge Control Agents and Particle Stabilizers

Charge control agents are used to provide good electrophoretic mobility to the electrophoretic particles. Stabilizers are used to prevent agglomeration of the electrophoretic particles, as well as prevent the electrophoretic particles from irreversibly depositing onto the capsule wall. Either component can be constructed from materials across a wide range of molecular weights (low molecular weight, oligomeric, or polymeric), and may be pure or a mixture. In particular, suitable charge control agents are generally adapted from the liquid toner art. The charge control agent used to modify and/or stabilize the particle surface charge is applied as generally known in the arts of liquid toners, electrophoretic displays, non-aqueous paint dispersions, and engine-oil additives. In all of these arts, charging species may be added to non-aqueous media in order to increase electrophoretic mobility or increase electrostatic stabilization. The materials can improve steric stabilization as well. Different theories of charging are postulated, including selective ion adsorption, proton transfer, and contact electrification.

An optional charge control agent or charge director may be used. These constituents typically consist of low molecular weight surfactants, polymeric agents, or blends of one or more components and serve to stabilize or otherwise modify the sign and/or magnitude of the charge on the electrophoretic particles. The charging properties of the pigment itself may be accounted for by taking into account the acidic or basic surface properties of the pigment, or the charging sites may take place on the carrier resin surface (if present), or a combination of the two. Additional pigment properties which may be relevant are the particle size distribution, the chemical composition, and the lightfastness. The charge control agent used to modify and/or stabilize the particle surface charge is applied as generally known in the arts of liquid toners, electrophoretic displays, non-aqueous paint dispersions, and engine-oil additives. In all of these arts, charging species may be added to non-aqueous media in order to increase electrophoretic mobility or increase electrostatic stabilization. The materials can improve steric stabilization as well. Different theories of charging are postulated, including selective ion adsorption, proton transfer, and contact electrification.

Charge adjuvants may also be added. These materials increase the effectiveness of the charge control agents or charge directors. The charge adjuvant may be a polyhydroxy compound or an aminoalcohol compound, which are preferably soluble in the suspending fluid in an amount of at least 2% by weight. Examples of polyhydroxy compounds which contain at least two hydroxyl groups include, but are not limited to, ethylene glycol, 2,4,7,9-tetramethyl-decyne-4,7-diol, poly(propylene glycol), pentaethylene glycol, tripropylene glycol, triethylene glycol, glycerol, pentaerythritol, glycerol tris(12-hydroxystearate), propylene glycol monohydroxystearate, and ethylene glycol monohydroxystearate. Examples of aminoalcohol compounds which contain at least one alcohol function and one amine function in the same molecule include, but are not limited to, triisopropanolamine, triethanolamine, ethanolamine, 3-amino-1-propanol, o-aminophenol, 5-amino-1-pentanol, and tetrakis(2-hydroxyethyl)ethylene-diamine. The charge adjuvant is preferably present in the suspending fluid in an amount of about 1 to about 100 mg/g of the particle mass, and more preferably about 50 to about 200 mg/g.

The surface of the particle may also be chemically modified to aid dispersion, to improve surface charge, and to improve the stability of the dispersion, for example. Surface modifiers include organic siloxanes, organohalogen silanes and other functional silane coupling agents (Dow Corning® Z-6070, Z-6124, and 3 additive, Midland, Mich.); organic titanates and zirconates (Tyzor® TOT, TBT, and TE Series, DuPont, Wilmington, Del.); hydrophobing agents, such as long chain (C12 to C50) alkyl and alkyl benzene sulphonic acids, fatty amines or diamines and their salts or quarternary derivatives; and amphipathic polymers which can be covalently bonded to the particle surface.

In general, it is believed that charging results as an acid-base reaction between some moiety present in the continuous phase and the particle surface. Thus useful materials are those which are capable of participating in such a reaction, or any other charging reaction as known in the art Different non-limiting classes of charge control agents which are useful include organic sulfates or sulfonates, metal soaps, block or comb copolymers, organic amides, organic zwitterions, and organic phosphates and phosphonates. Useful organic sulfates and sulfonates include, but are not limited to, sodium bis(2-ethyl hexyl) sulfosuccinate, calcium dodecyl benzene sulfonate, calcium petroleum sulfonate, neutral or basic barium dinonylnaphthalene sulfonate, neutral or basic calcium dinonylnaphthalene sulfonate, dodecylbenzenesulfonic acid sodium salt, and ammonium lauryl sulphate. Useful metal soaps include, but are not limited to, basic or neutral barium petronate, calcium petronate, Co-, Ca-, Cu-, Mn-, Ni-, Zn-, and Fe-salts of naphthenic acid, Ba-, Al-, Zn-, Cu-, Pb-, and Fe-salts of stearic acid, divalent and trivalent metal carboxylates, such as aluminum tristearate, aluminum octanoate, lithium heptanoate, iron stearate, iron distearate, barium stearate, chromium stearate, magnesium octanoate, calcium stearate, iron naphthenate, and zinc naphthenate, Mn- and Zn-heptanoate, and Ba-, Al-, Co-, Mn-, and Zn-octanoate. Useful block or comb copolymers include, but are not limited to, AB diblock copolymers of (A) polymers of 2-(N,N)-dimethylaminoethyl methacrylate quaternized with methyl-p-toluenesulfonate and (B) poly-2-ethylhexyl methacrylate, and comb graft copolymers with oil soluble tails of poly (12-hydroxystearic acid) and having a molecular weight of about 1800, pendant on an oil-soluble anchor group of poly (methyl methacrylate-methacrylic acid). Useful organic amides include, but are not limited to, polyisobutylene succinimides such as OLOA 371 and 1200, and N-vinyl pyrrolidone polymers. Useful organic zwitterions include, but are not limited to, lecithin. Useful organic phosphates and phosphonates include, but are not limited to, the sodium salts of phosphated mono- and di-glycerides with saturated and unsaturated acid substituents.

Particle dispersion stabilizers may be added to prevent particle flocculation or attachment to the capsule walls. For the typical high resistivity liquids used as suspending fluids in electrophoretic displays, nonaqueous surfactants may be used. These include, but are not limited to, glycol ethers, acetylenic glycols, alkanolamides, sorbitol derivatives, alkyl amines, quaternary amines, imidazolines, dialkyl oxides, and sulfosuccinates.

D. Encapsulation

There is a long and rich history to encapsulation, with numerous processes and polymers having proven useful in creating capsules. Encapsulation of the internal phase may be accomplished in a number of different ways. Numerous suitable procedures for microencapsulation are detailed in both *Microencapsulation, Processes and Applications*, (I. E. Vandegaer, ed.), Plenum Press, New York, N.Y. (1974) and Gutcho, *Microcapsules and Mircroencapsulation Techniques*, Nuyes Data Corp., Park Ridge, N.J. (1976). The processes fall into several general categories, all of which can be applied to the present invention: interfacial polymerization, in situ polymerization, physical processes, such as coextrusion and other phase separation processes, in-liquid curing, and simple/complex coacervation.

Numerous materials and processes should prove useful in formulating displays of the present invention. Useful materials for simple coacervation processes include, but are not limited to, gelatin, polyvinyl alcohol, polyvinyl acetate, and cellulosic derivatives, such as, for example, carboxymethylcellulose. Useful materials for complex coacervation processes include, but are not limited to, gelatin, acacia, carageenan, carboxymethylcellulose, hydrolyzed styrene anhydride copolymers, agar, alginate, casein, albumin, methyl vinyl ether co-maleic anhydride, and cellulose phthalate. Useful materials for phase separation processes include, but are not limited to, polystyrene, PMMA, polyethyl methacrylate, polybutyl methacrylate, ethyl cellulose, polyvinyl pyridine, and poly acrylonitrile. Useful materials for in situ polymerization processes include, but are not limited to, polyhydroxyamides, with aldehydes, melamine, or urea and formaldehyde; water-soluble oligomers of the condensate of melamine, or urea and formaldehyde; and vinyl monomers, such as, for example, styrene, MMA and acrylonitrile. Finally, useful materials for interfacial polymerization processes include, but are not limited to, diacyl chlorides, such as, for example, sebacoyl, adipoyl, and di- or poly-amines or alcohols, and isocyanates. Useful emulsion polymerization materials may include, but are not limited to, styrene, vinyl acetate, acrylic acid, butyl acrylate, tbutyl acrylate, methyl methacrylate, and butyl methacrylate.

Capsules produced may be dispersed into a curable carrier, resulting in an ink which may be printed or coated on large and arbitrarily shaped or curved surfaces using conventional printing and coating techniques.

In the context of the present invention, one skilled in the art will select an encapsulation procedure and wall material based on the desired capsule properties. These properties include the distribution of capsule radii; electrical, mechanical, diffusion, and optical properties of the capsule wall; and chemical compatibility with the internal phase of the capsule.

The capsule wall generally has a high electrical resistivity. Although it is possible to use walls with relatively low resistivities, this may limit performance in requiring relatively higher addressing voltages. The capsule wall should also be mechanically strong (although if the finished capsule powder is to be dispersed in a curable polymeric binder for coating, mechanical strength is not as critical). The capsule wall should generally not be porous. If, however, it is desired to use an encapsulation procedure that produces porous capsules, these can be overcoated in a post-processing step (i.e., a second encapsulation). Moreover, if the capsules are to be dispersed in a curable binder, the binder will serve to close the pores. The capsule walls should be optically clear. The wall material may, however, be chosen to match the refractive index of the internal phase of the capsule (i.e., the suspending fluid) or a binder in which the capsules are to be dispersed. For some applications (e.g., interposition between two fixed electrodes), monodispersed capsule radii are desirable.

An encapsulation procedure involves a polymerization between urea and formaldehyde in an aqueous phase of an oil/water emulsion in the presence of a negatively charged, carboxyl-substituted, linear hydrocarbon polyelectrolyte material. The resulting capsule wall is a urea/formaldehyde copolymer, which discretely encloses the internal phase. The capsule is clear, mechanically strong, and has good resistivity properties.

The related technique of in situ polymerization utilizes an oil/water emulsion, which is formed by dispersing the electrophoretic composition (i.e., the dielectric liquid containing a suspension of the pigment particles) in an aqueous environment. The monomers polymerize to form a polymer with higher affinity for the internal phase than for the aqueous phase, thus condensing around the emulsified oily droplets. In one especially useful in situ polymerization processes, urea and formaldehyde condense in the presence of poly (acrylic acid) (See, e.g., U.S. Pat. No. 4,001,140). In other useful process, any of a variety of cross-linking agents borne in aqueous solution is deposited around microscopic oil droplets. Such cross-linking agents include aldehydes, especially formaldehyde, glyoxal, or glutaraldehyde; alum; zirconium salts; and poly isocyanates. The entire disclosures of the U.S. Pat. Nos. 4,001,140 and 4,273,672 patents are hereby incorporated by reference herein.

The coacervation approach also utilizes an oil/water emulsion. One or more colloids are coacervated (i.e., agglomerated) out of the aqueous phase and deposited as shells around the oily droplets through control of temperature, pH and/or relative concentrations, thereby creating the microcapsule. Materials suitable for coacervation include gelatins and gum arabic.

The interfacial polymerization approach relies on the presence of an oil-soluble monomer in the electrophoretic composition, which once again is present as an emulsion in an aqueous phase. The monomers in the minute hydrophobic droplets react with a monomer introduced into the aqueous phase, polymerizing at the interface between the droplets and the surrounding aqueous medium and forming shells around the droplets. Although the resulting walls are relatively thin and may be permeable, this process does not require the elevated temperatures characteristic of some other processes, and therefore affords greater flexibility in terms of choosing the dielectric liquid.

Coating aids can be used to improve the uniformity and quality of the coated or printed electrophoretic ink material. Wetting agents are typically added to adjust the interfacial tension at the coating/substrate interface and to adjust the liquid/air surface tension. Wetting agents include, but are not limited to, anionic and cationic surfactants, and nonionic species, such as silicone or fluoropolymer based materials. Dispersing agents may be used to modify the interfacial tension between the capsules and binder, providing control over flocculation and particle settling.

Surface tension modifiers can be added to adjust the air/ink interfacial tension. Polysiloxanes are typically used in such an application to improve surface leveling while minimizing other defects within the coating. Surface tension modifiers include, but are not limited to, fluorinated surfactants, such as, for example, the Zonyl® series from DuPont (Wilmington, Del.), the Fluorod® series from 3M (St. Paul, Minn.), and the fluoroakyl series from Autochem (Glen Rock, N.J.); siloxanes, such as, for example, Silwet® from Union Carbide (Danbury, Conn.); and polyethoxy and polypropoxy alcohols. Antifoams, such as silicone and silicone-free polymeric materials, may be added to enhance the movement of air from within the ink to the surface and to facilitate the rupture of bubbles at the coating surface. Other useful antifoams include, but are not limited to, glyceryl esters, polyhydric alcohols, compounded antifoams, such as oil solutions of alkyl benzenes, natural fats, fatty acids, and metallic soaps, and silicone antifoaming agents made from the combination of dimethyl siloxane polymers and silica. Stabilizers such as uv-absorbers and antioxidants may also be added to improve the lifetime of the ink.

Other additives to control properties like coating viscosity and foaming can also be used in the coating fluid. Stabilizers (UV-absorbers, antioxidants) and other additives which could prove useful in practical materials.

E. Binder Material

The binder is used as a non-conducting, adhesive medium supporting and protecting the capsules, as well as binding the electrode materials to the capsule dispersion. Binders are available in many forms and chemical types. Among these are water-soluble polymers, water-borne polymers, oil-soluble polymers, thermoset and thermoplastic polymers, and radiation-cured polymers.

Among the water-soluble polymers are the various polysaccharides, the polyvinyl alcohols, N-methylpyrrolidone, N-vinylpyrrolidone, the various Carbowax® species (Union Carbide, Danbury, Conn.), and poly-2-hydroxyethylacrylate.

The water-dispersed or water-borne systems are generally latex compositions, typified by the Neorez® and Neocryl® resins (Zeneca Resins, Wilmington, Mass.), Acrysol® (Rohm and Haas, Philadelphia, Pa.), Bayhydrol® (Bayer, Pittsburgh, Pa.), and the Cytec Industries (West Paterson, N.J.) HP line. These are generally latices of polyurethanes, occasionally compounded with one or more of the acrylics, polyesters, polycarbonates or silicones, each lending the final cured resin in a specific set of properties defined by glass transition temperature, degree of "tack," softness, clarity, flexibility, water permeability and solvent resistance, elongation modulus and tensile strength, thermoplastic flow, and solids level. Some water-borne systems can be mixed with reactive monomers and catalyzed to form more complex resins. Some can be further cross-linked by the use of a crosslinking reagent, such as an aziridine, for example, which reacts with carboxyl groups.

A typical application of a water-borne resin and aqueous capsules follows. A volume of particles is centrifuged at low speed to separate excess water. After a given centrifugation process, for example 10 minutes at 60×G, the capsules are found at the bottom of the centrifuge tube, while the water portion is at the top. The water portion is carefully removed (by decanting or pipetting). The mass of the remaining capsules is measured, and a mass of resin is added such that the mass of resin is between one eighth and one tenth of the weight of the capsules. This mixture is gently mixed on an oscillating mixer for approximately one half hour. After about one half hour, the mixture is ready to be coated onto the appropriate substrate.

The thermoset systems are exemplified by the family of epoxies. These binary systems can vary greatly in viscosity, and the reactivity of the pair determines the "pot life" of the mixture. If the pot life is long enough to allow a coating operation, capsules may be coated in an ordered arrangement in a coating process prior to the resin curing and hardening.

Thermoplastic polymers, which are often polyesters, are molten at high temperatures. A typical application of this type of product is hot-melt glue. A dispersion of heat-resistant capsules could be coated in such a medium. The solidification process begins during cooling, and the final hardness, clarity and flexibility are affected by the branching and molecular weight of the polymer.

Oil or solvent-soluble polymers are often similar in composition to the waterborne system, with the obvious exception of the water itself. The latitude in formulation for solvent systems is enormous, limited only by solvent choices and polymer solubility. Of considerable concern in solvent-based systems is the viability of the capsule itself—the integrity of the capsule wall cannot be compromised in any way by the solvent.

Radiation cure resins are generally found among the solvent-based systems. Capsules may be dispersed in such a medium and coated, and the resin may then be cured by a timed exposure to a threshold level of ultraviolet radiation, either long or short wavelength. As in all cases of curing polymer resins, final properties are determined by the branching and molecular weights of the monomers, oligomers and crosslinkers.

A number of "water-reducible" monomers and oligomers are, however, marketed. In the strictest sense, they are not water soluble, but water is an acceptable diluent at low concentrations and can be dispersed relatively easily in the mixture. Under these circumstances, water is used to reduce the viscosity (initially from thousands to hundreds of thousands centipoise). Water-based capsules, such as those made from a protein or polysaccharide material, for example, could be dispersed in such a med;um and coated, provided the viscosity could be sufficiently lowered. Curing in such systems is generally by ultraviolet radiation.

While the invention has been particularly shown and described with reference to specific preferred embodiments, it should be understood by those skilled in the art that various changes in form and detail may be made therein without departing from the spirit and scope of the invention as defined by the appended claims.

What is claimed is:

1. A process for forming a semiconductor film comprising the steps of:
    a) providing a substrate comprising an organic semiconductor film;
    b) providing a solvent;
    c) vaporizing at least a portion of the solvent such that the vapor comes into contact with the substrate; and
    d) controlling a chemical potential of the vapor molecules to provide an interaction with the organic semiconductor film to alter a molecular arrangement of the organic semiconductor film.

2. The process of claim 1 wherein step b) comprises placing the substrate on a first stage and controlling a temperature of the first stage and step c) comprises placing the solvent on a second stage and controlling a temperature of the second stage.

3. The process of claim 1 further comprising the step of f) annealing the substrate.

4. The process of claim 3 wherein step f) comprises annealing the substrate for a period ranging from about five minutes to about one day.

5. The process of claim 3 wherein annealing the substrate comprises increasing a temperature of the substrate to within a range of about 80° C. to 150° C.

6. The process of claim 3 wherein step e) comprises controlling the chemical potential of the vapor by controlling a temperature of the solvent and step f) comprises annealing the substrate with a high enough substrate temperature to avoid condensation of the vapor.

7. The process of claim 6 wherein a temperature difference between the solvent and the substrate is substantially small.

8. The process of claim 1 wherein step e) comprises controlling the chemical potential of the vapor by controlling a temperature of the solvent.

9. The process of claim 8 wherein step e) comprises controlling a temperature of the solvent in a range from about 0° C. to about 50° C.

10. The process of claim 1 wherein step e) comprises controlling the chemical potential of the vapor to prevent dewetting of the organic semiconductor film.

11. The process of claim 1 further comprising the step of placing the substrate in a sufficiently sealed chamber.

12. The process of claim 11 wherein step e) comprises controlling the chemical potential of the vapor by controlling a temperature of the chamber.

13. The process of claim 11 further comprising evacuating the chamber prior to placing the substrate and the solvent in the chamber.

14. The process of claim 11 further comprising purging the chamber with gas prior to placing the substrate and the solvent in the chamber.

15. The process of claim 1 wherein the solvent is one which can dissolve the organic semiconductor film.

16. The process of claim 1 wherein the solvent is one which can swell the organic semiconductor film.

17. The process of claim 1 wherein step a) comprises providing the substrate comprising a poly(alkylthiophene)

semiconductor film and step c) comprises providing a solvent comprising toluene, chloroform, or xylene.

18. An encapsulated electrophoretic display comprising:
- an encapsulated electrophoretic display medium comprising a plurality of microcapsules, each capsule comprising one of electrophoretic particles, suspended particles and a bichromal sphere; and
- an active matrix addressing logic adjacent to the display medium and comprising an array of organic thin-film transistors formed by the method comprising the steps of:
  - a) providing a substrate comprising an organic semiconductor film;
  - b) providing a solvent;
  - c) vaporizing at least a portion of the solvent such that the vapor comes into contact with the substrate; and
  - d) controlling a chemical potential of the vapor molecules to provide an interaction with the organic semiconductor film to alter a molecular arrangement of the organic semiconductor film.

\* \* \* \* \*